(12) United States Patent
Wang et al.

(10) Patent No.: US 11,133,334 B2
(45) Date of Patent: Sep. 28, 2021

(54) ARRAY SUBSTRATE WITH STACKED GATE LINES, MANUFACTURING METHOD THEREOF, AND DISPLAY DEVICE WITH STACKED GATE LINES

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventors: Xiang Wang, Beijing (CN); Zhen Zhang, Beijing (CN); Ru Zhou, Beijing (CN)

(73) Assignees: BOE TECHNOLOGY GROUP CO., LTD., Beijing (CN); HEFEI BOE OPTOELECTRONICS TECHNOLOGY CO., LTD., Anhui (CN)

( * ) Notice: Subject to any disclaimer, the term of this patent is extended or adjusted under 35 U.S.C. 154(b) by 0 days.

(21) Appl. No.: 15/984,744

(22) Filed: May 21, 2018

(65) Prior Publication Data
US 2019/0027500 A1 Jan. 24, 2019

(30) Foreign Application Priority Data

Jul. 21, 2017 (CN) .......................... 201710601592.6

(51) Int. Cl.
*H01L 27/12* (2006.01)
*H01L 29/417* (2006.01)
*H01L 29/786* (2006.01)

(52) U.S. Cl.
CPC ........ *H01L 27/124* (2013.01); *H01L 27/1248* (2013.01); *H01L 27/1259* (2013.01);
(Continued)

(58) Field of Classification Search
CPC ............ G02F 1/136286; G02F 1/1368; G02F 1/134309; H01L 27/124; H01L 29/78648;
(Continued)

(56) References Cited

U.S. PATENT DOCUMENTS

2007/0158655 A1 7/2007 Lin
2010/0245735 A1 9/2010 Xie et al.
(Continued)

FOREIGN PATENT DOCUMENTS

CN 101847640 A 9/2010
CN 102566166 A 7/2012
(Continued)

OTHER PUBLICATIONS

First Office Action for Chinese Patent Application No. 201710601592.6 dated Jun. 24, 2019.

*Primary Examiner* — David Chen
(74) *Attorney, Agent, or Firm* — Calfee, Halter & Griswold LLP

(57) ABSTRACT

An array substrate, a manufacturing method thereof, and a display device including the array substrate. The array substrate includes a plurality of gate line groups and a plurality of data lines disposed on a substrate, the plurality of gate line groups intersecting with the plurality of data lines to define a plurality of pixel units arranged in an array, wherein each of the plurality of gate line groups includes a first gate line and a second gate line insulated from each other, and orthographic projections of the first gate line and the second gate line of each of the plurality of gate line groups on the substrate at least partially overlap.

9 Claims, 3 Drawing Sheets

(52) U.S. Cl.
CPC ...... *H01L 29/41733* (2013.01); *H01L 29/786* (2013.01); *G09G 2300/0426* (2013.01)

(58) Field of Classification Search
CPC ........... H01L 29/78645; H01L 27/1259; H01L 29/41733; H01L 29/786; G09G 2300/0426; G09G 2300/0421; G09G 2300/0465
USPC ........................ 257/40, 59, 72, 390, E29.273
See application file for complete search history.

(56) References Cited

U.S. PATENT DOCUMENTS

| | | | |
|---|---|---|---|
| 2011/0279418 A1* | 11/2011 | Han | G02F 1/136286 345/204 |
| 2012/0161140 A1 | 6/2012 | Xue et al. | |
| 2013/0141660 A1* | 6/2013 | Wang | G02F 1/136286 349/43 |
| 2015/0206903 A1* | 7/2015 | Gao | G02F 1/136286 257/72 |
| 2015/0355517 A1* | 12/2015 | Huang | H01L 27/1244 257/72 |
| 2018/0095334 A1 | 4/2018 | Zang et al. | |

FOREIGN PATENT DOCUMENTS

| | | |
|---|---|---|
| CN | 105572996 A | 5/2016 |
| KR | 20130026375 A | 3/2013 |

\* cited by examiner

ARRAY SUBSTRATE WITH STACKED GATE LINES, MANUFACTURING METHOD THEREOF, AND DISPLAY DEVICE WITH STACKED GATE LINES

RELATED APPLICATION

The present application claims the benefit of Chinese Patent Application No. 201710601592.6, filed on Jul. 21, 2017, the entire disclosure of which is incorporated herein by reference.

FIELD

The present disclosure relates to the field of display technologies, and particularly to an array substrate, a manufacturing method thereof, and a display device.

BACKGROUND

With the continuous development of display technologies, various driving technologies with reduced costs are widely used in display devices. In particular, Dual Gate technology has attracted widespread attention as a technology that can reduce product costs.

In Dual Gate technology, the number of data lines of a display panel is reduced by half, and the number of gate lines is doubled. Accordingly, the number of source driving ICs (Integrated Circuits) connected to the data lines is reduced by half, and the number of gate driving ICs connected to the gate lines is doubled. Since the unit price of a gate driving IC is generally lower than that of a source driving IC, cost is accordingly reduced.

At present, in Dual Gate technology, the gate lines are arranged in parallel in a same layer, and widths of two parallel gate lines and spacing between them occupy too much area, leading to reduction of the aperture ratio of an array substrate, thereby affecting the transmittance of the array substrate.

SUMMARY

In view of the above, embodiments of the present disclosure provide an improved array substrate, a manufacturing method thereof, and a display device.

In an aspect of the present disclosure, there is provided an array substrate comprising a plurality of gate line groups and a plurality of data lines disposed on a substrate, the plurality of gate line groups intersecting with the plurality of data lines to define a plurality of pixel units arranged in an array, wherein each of the plurality of gate line groups includes a first gate line and a second gate line insulated from each other, and orthographic projections of the first gate line and the second gate line of each of the plurality of gate line groups on the substrate at least partially overlap.

According to some embodiments, each row of pixel units includes a plurality of pixel unit groups, each of the plurality of pixel unit groups includes a first pixel unit and a second pixel unit, and the first pixel unit and the second pixel unit of each of the plurality of pixel unit groups share one data line.

According to some embodiments, in each of the plurality of pixel unit groups, a thin film transistor of the first pixel unit is connected to a first gate line in a corresponding gate line group, and a thin film transistor of the second pixel unit is connected to a second gate line in the corresponding gate line group.

According to some embodiments, the array substrate further comprises an insulating film layer disposed between the first gate line and the second gate line of each of the plurality of gate line groups, the first gate line is disposed at a side of the insulating film layer close to the substrate, the second gate line is disposed at a side of the insulating film layer away from the substrate, and at a position of the thin film transistor of the first pixel unit, the array substrate further comprises a first gate connection line disposed in a same layer as the second gate line, the first gate connection line being electrically connected to the first gate line.

According to some embodiments, at an intersection of a data line and a gate line group, orthographic projections of the first gate line and the second gate line in the gate line group on the substrate do not overlap.

According to some embodiments, orthographic projections of the first gate line and the first gate connection line on the substrate completely overlap.

According to some embodiments, in an area of the array substrate other than the intersection of the data line and the gate line group, orthographic projections of the first gate line and the second gate line on the substrate completely overlap.

In another aspect of the present disclosure, there is provided a display device comprising any of the array substrates described above.

In a further aspect of the present disclosure, there is provided a manufacturing method of an array substrate, comprising: forming a plurality of gate line groups and a plurality of data lines on a substrate, the plurality of gate line groups intersecting with the plurality of data lines to define a plurality of pixel units arranged in an array. Forming each of the plurality of gate line groups comprises: forming a first gate line on the substrate; forming an insulating film layer on an exposed portion of the substrate and the first gate line; and forming a second gate line on the insulating film layer. Orthographic projections of the first gate line and the second gate line on the substrate at least partially overlap.

According to some embodiments, the step of forming a second gate line on the insulating film layer comprises: forming a via hole in the insulating film layer; and forming the second gate line and a first gate connection line in a same layer on the insulating film layer. The first gate line is electrically connected to the first gate connection line through the via hole, and the first gate connection line is located at a position of a thin film transistor connected to the first gate line.

According to some embodiments, at an intersection of a data line and a gate line group, orthographic projections of the first gate line and the second gate line in the gate line group on the substrate do not overlap.

According to some embodiments, orthographic projections of the first gate line and the first gate connection line on the substrate completely overlap.

According to some embodiments, in an area of the array substrate other than the intersection of the data line and the gate line group, orthographic projections of the first gate line and the second gate line on the substrate completely overlap.

According to some embodiments, after the step of forming a second gate line on the insulating film layer, the manufacturing method further comprises: forming a gate insulating layer, an active layer, a data line, a drain, a common electrode, a first electrode layer, a passivation layer, and a second electrode layer on the second gate line.

DETAILED DESCRIPTION

To make the above objectives, features, and advantages of the present disclosure apparent, the present disclosure will be further described in detail below with reference to the accompanying drawings and specific implementations.

Figure 1:
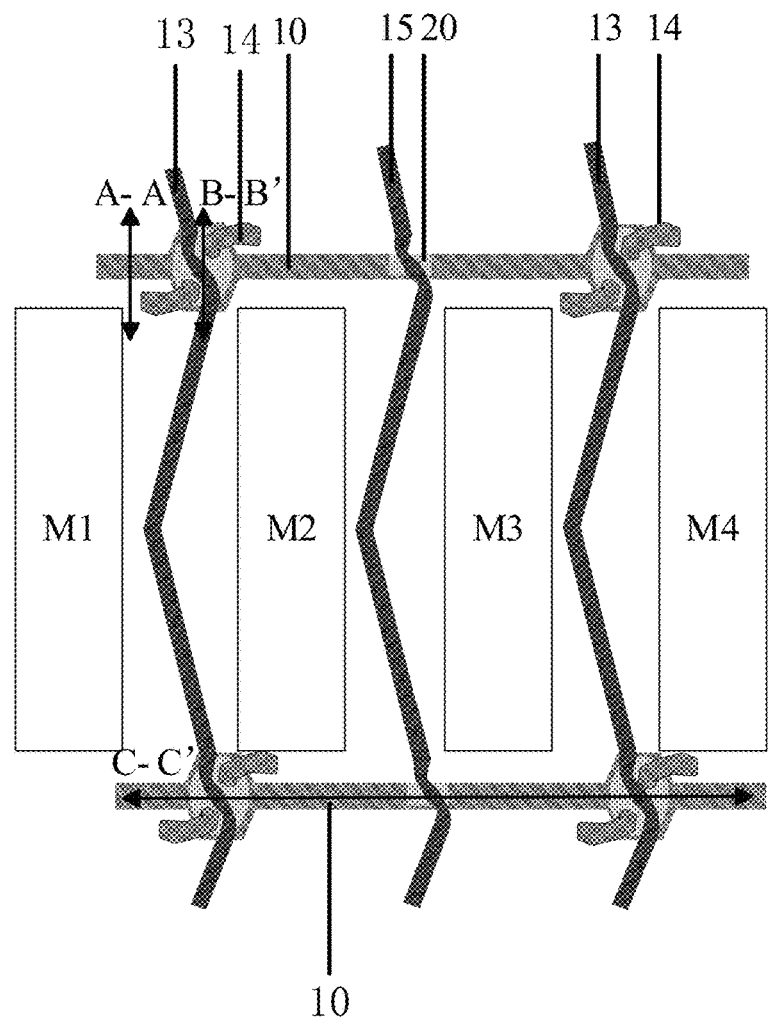
FIG. 1 schematically shows a partial structural diagram of an array substrate provided by embodiments of the present disclosure.

Referring to FIG. 1, a partial structural schematic diagram of an array substrate provided by embodiments of the present disclosure is illustrated.

As shown in FIG. 1, the array substrate comprises a plurality of gate line groups 10 and a plurality of data lines 13 formed on a substrate, and a plurality of pixel units M1, M2, M3 and M4 arranged in an array. Each gate line group 10 includes a first gate line and a second gate line insulated from each other, and orthographic projections of the first gate line and the second gate line on the substrate at least partially overlap (in particular, as shown in FIG. 1, the orthographic projections of the first gate line and the second gate line on the substrate completely overlap).

In a typical array substrate, width of each gate line group is the sum of widths of two parallel gate lines and spacing between them as viewed from a top surface of the array substrate. In contrast, in the array substrate according to embodiments of the present disclosure, by disposing the first gate line and the second gate line of each gate line group 10 such that their orthographic projections on the substrate at least partially overlap, width of each gate line group 10 is smaller than the sum of widths of two gate lines as viewed from a top surface of the array substrate, and particularly may be just width of one gate line. Therefore, compared to the typical array substrate, the array substrate according to embodiments of the present disclosure can effectively reduce the area occupied by the gate lines. On this basis, width of at least one gate line in a gate line group can be appropriately increased so as to decrease wire resistance of the gate line and reduce gate delay. As will be appreciated by those skilled in the art, in this case, it should be ensured that the width of the gate line group is still smaller than the sum of widths of two parallel gate lines and spacing between them, so that the area occupied by the gate lines can be effectively reduced as compared to the typical array substrate.

In FIG. 1, M1, M2, M3 and M4 each represent one pixel unit, reference numeral 15 denotes a common electrode, reference numeral 14 denotes a drain, and reference numeral 20 denotes an active layer. Since FIG. 1 just shows a partial structural schematic diagram of the array substrate, a common electrode 15 on the left side of the pixel unit M1 is not shown in FIG. 1, and a common electrode 15 on the right side of the pixel unit M4 is not shown in FIG. 1, either. It is to be noted that M1, M2, M3 or M4 only indicates a position where a pixel unit resides, and does not indicate the area occupied by the pixel unit or the structure thereof.

A gate line group 10 including a first gate line and a second gate line is disposed between two adjacent rows of pixel units. As shown in FIG. 1, the pixel units M1, M2, M3 and M4 may be pixel units of the M-th row, where M is an integer greater than 1. Pixel units of the (M−1)-th row (not shown in FIG. 1) are located on the other side of a gate line group 10 above the pixel units of the M-th row, and pixel units of the (M+1)-th row (not shown in FIG. 1) are located on the other side of a gate line group 10 below the pixel units of the M-th row. Each gate line group 10 includes a first gate line and a second gate line. That is, a first gate line and a second gate line are disposed between the pixel units of the (M−1)-th row and the pixel units of the M-th row, and a first gate line and a second gate line are also disposed between the pixel units of the M-th row and the pixel units of the (M+1)-th row.

Each row of pixel units includes a plurality of pixel unit groups, each pixel unit group includes a first pixel unit and a second pixel unit, and the first pixel unit and the second pixel unit in each pixel unit group share one data line. As shown in FIG. 1, M1, M2, M3 and M4 represent a part of pixel units in the pixel units of the M-th row, wherein the pixel unit M1 and the pixel unit M2 can be regarded as one pixel unit group M12, the pixel unit M3 and pixel unit M4 can be regarded as another pixel unit group M34, and the two pixel unit groups are arranged adjacent to each other. That is, the pixel unit group M12 includes a first pixel unit M1 and a second pixel unit M2, the pixel unit group M34 includes a first pixel unit M3 and a second pixel unit M4, the first pixel unit M1 and the second pixel unit M2 share one data line 13, and the first pixel unit M3 and the second pixel unit M4 also share one data line 13. A common electrode is disposed between two adjacent pixel unit groups. Specifically, as shown in FIG. 1, a common electrode 15 is disposed between the pixel unit group M12 and the pixel unit group M34.

It is to be noted that, although a row of pixel units including four pixel units is schematically illustrated in FIG. 1, as will be appreciated by those skilled in the art, this is merely illustrative. Depending on the resolution and the size of the display device, each row of pixel units may include any number of pixel units and any number of pixel unit groups, wherein each pixel unit group includes two pixel units.

In embodiments of the present disclosure, in each pixel unit group, a thin film transistor of the first pixel unit is connected to a first gate line in a corresponding gate line group, and a thin film transistor of the second pixel unit is connected to a second gate line in the corresponding gate line group. In the embodiment shown in FIG. 1, the thin film transistor of the first pixel unit M1 is connected to the first gate line in the gate line group 10 above the pixel unit group M12, and the thin film transistor of the second pixel unit M2 is connected to the second gate line in the gate line group 10 above the pixel unit group M12.

A structure of the array substrate according to the present disclosure will be described below in conjunction with the schematic diagrams showing states of film layers at respective positions.

Figure 2:
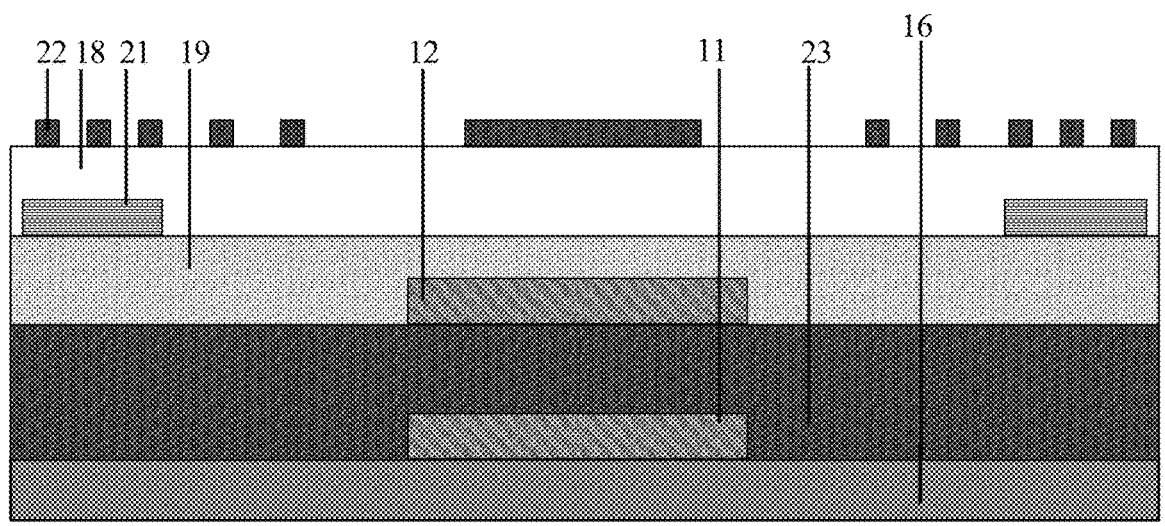
FIG. 2 shows a sectional view of the array substrate according to embodiments of the present disclosure as shown in FIG. 1 taken along A-A'.

Referring to FIG. 2, a sectional view of the array substrate according to embodiments of the present disclosure as shown in FIG. 1 taken along A-A' is illustrated.

In embodiments of the present disclosure, the sectional view of the array substrate taken along A-A' is a schematic diagram showing the states of the film layers at positions other than the position where TFTs (Thin Film Transistor) reside. As shown in FIG. 2, a first gate line 11, an insulating film layer 23, and a second gate line 12 are disposed on a substrate 16, successively, wherein orthographic projections of the first gate line 11 and the second gate line 12 on the substrate 16 at least partially overlap.

In some embodiments, the insulating film layer 23 may be a GI (Gate Insulator) film, or may be a PS (polystyrene) film or the like. Alternatively, the insulating film layer 23 may be an organic film layer. Thickness of an organic film layer is on the order of micrometers, so a thicker organic film layer increases the distance between the first gate line 11 and the second gate line 12 as compared to a GI film or a PS film that is usually on the order of $10^{-7}$ m. Thus, capacitance is reduced, thereby reducing load. For example, the organic film layer may be made of a resin material.

Further, a gate insulating layer 19, a first electrode layer 21, a passivation layer 18, and a second electrode layer 22 are disposed on an exposed portion of the insulating film layer 23 and the second gate line 12, successively. In an exemplary embodiment, the first electrode layer 21 and the second electrode layer 22 may be made of ITO (Indium Tin Oxide).

Figure 3:
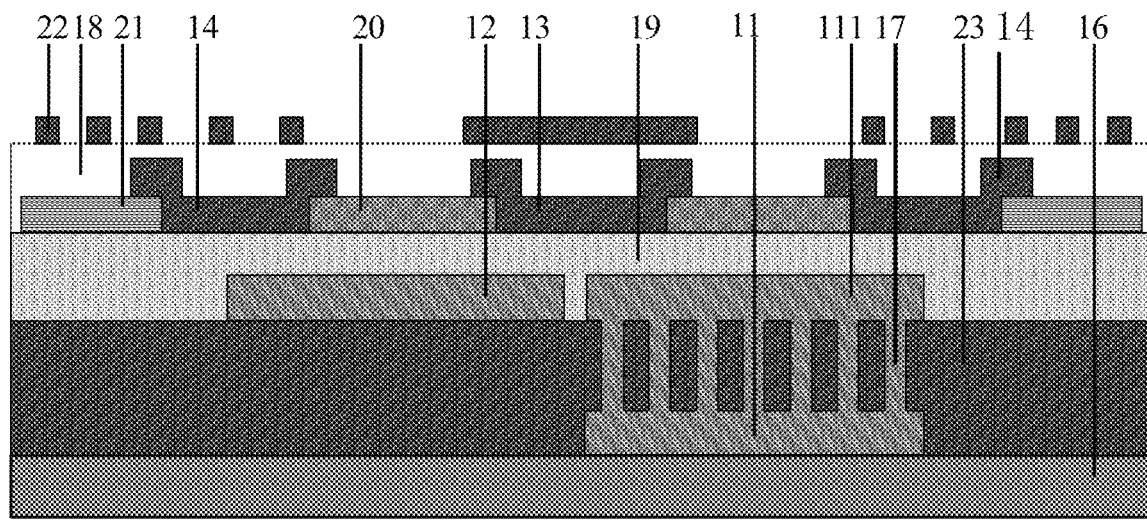
FIG. 3 shows a sectional view of the array substrate according to embodiments of the present disclosure as shown in FIG. 1 taken along B-B'.

Referring to FIG. 3, a sectional view of the array substrate according to embodiments of the present disclosure as shown in FIG. 1 taken along B-B' is illustrated.

In embodiments of the present disclosure, the sectional view of the array substrate taken along B-B' is a schematic diagram showing states of film layers at positions where TFTs reside. As shown in FIG. 3, a first gate line 11 and an insulating film layer 23 are disposed on the substrate 16, successively. A plurality of via holes 17 are provided at positions of the insulating film layer 23 corresponding to the first gate line 11, and a first gate connection line 111 is electrically connected to the first gate line 11 through the via hole 17. The array substrate further comprises a second gate line 12 disposed on the insulating film layer 23, a gate insulating layer 19 disposed on the second gate line 12, the first gate connection line 111 and an exposed portion of the insulating film layer 23, an active layer 20 and a first electrode layer 21 disposed on the gate insulating layer 19, and a data line 13 and a drain 14 disposed on an exposed portion of the gate insulating layer 19 and a portion of the active layer 20. In addition, a passivation layer 18 covers the first electrode layer 21, the drain 14, the active layer 20, and the data line 13, and a second electrode layer 22 is disposed on the passivation layer 18. In FIG. 3, the drain 14 and the active layer 20 on the left side can be regarded as a thin film transistor that belongs to a second pixel unit in one pixel unit group, the data line 13 is electrically connected to a source of the thin film transistor, and the thin film transistor is controlled by the second gate line 12. The drain 14 and the active layer 20 on the right side can be regarded as a thin film transistor that belongs to a first pixel unit in the same pixel group, the data line 13 is electrically connected to a source of the thin film transistor, and the thin film transistor is controlled by the first gate line 11 through the first gate connection line 111. The first electrode layer 21 is electrically connected to a corresponding drain 14 so as to provide a pixel voltage to a pixel unit where the drain 14 is located. The second electrode layer 22 serves to provide a common voltage to the pixel unit. Since being controlled by the first gate line 11 and the second gate line 12 respectively, different data signals can be written into two thin film transistors which are connected to the same data line 13, and it can be ensured that the numbers of data lines and expensive source driving integrated circuits corresponding to the data lines are reduced by half while the array substrate normally operates.

In conjunction with FIGS. 1 and 3, it can be seen that the orthographic projections of the first gate line 11 and the second gate line 12 on the substrate 16 may not overlap at the position of the TFT.

Specifically, as shown in FIG. 3, the first gate line 11 is disposed on a side of the insulating film layer 23 close to the substrate 16, and the second gate line 12 is disposed on a side of the insulating film layer 23 away from the substrate 16. At the position of the thin film transistor of the first pixel unit, the array substrate comprises a first gate connection line 111 formed in the same layer as the second gate line 12, and the first gate line 11 is electrically connected to the first gate connection line 111 through the via hole 17. By making the first gate connection line 111 in the same layer as the second gate line 12 and connected to the first gate line 11 through the via hole 17, thickness of the gate insulating layer between the first gate line and a corresponding thin film transistor can be equal to the thickness of the gate insulating layer between the second gate line and a corresponding thin film transistor, so that the two thin film transistors have the same operating characteristics.

Figure 4:
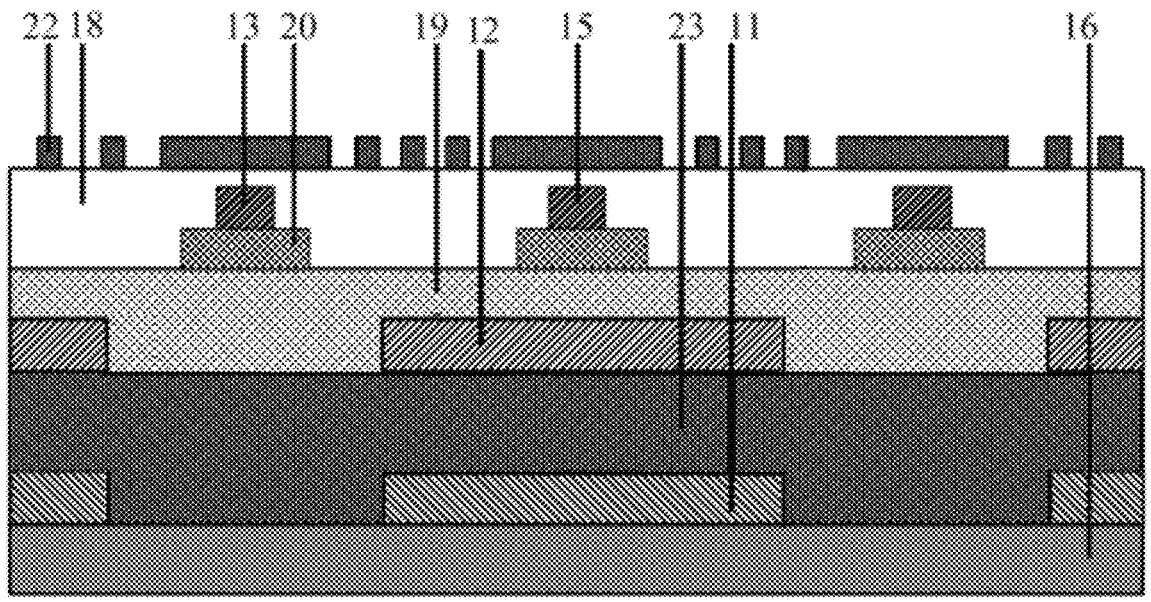
FIG. 4 shows a sectional view of the array substrate according to the present disclosure as shown in FIG. 1 taken along C-C'.

Referring to FIG. 4, a sectional view of the array substrate according to the present disclosure as shown in FIG. 1 taken along C-C' is illustrated.

In embodiments of the present disclosure, the sectional view of the array substrate along C-C' is a schematic diagram showing states of the film layers of the first gate line and the second gate line. As shown in FIG. 4, a first gate line 11, an insulating film layer 23 and a second gate line 12 are disposed on the substrate 16, successively. Further, in conjunction with FIGS. 2, 3 and 4, it can be seen that the array substrate further comprises the gate insulating layer 19, the active layer 20, the data line 13, the drain 14, the common electrode 15, the first electrode layer 21, the passivation layer 18, and the second electrode layer 22 disposed on the second gate line 12.

In embodiments of the present disclosure, a plurality of gate line groups and a plurality of data lines are disposed on the substrate, each gate line group includes a first gate line and a second gate line insulated from each other, and orthographic projections of the first gate line and the second gate line on the substrate at least partially overlap. By arranging the two gate lines in the array substrate in a stacked manner, width of each gate line group as viewed from a top surface of the array substrate can be greatly reduced, thereby effectively reducing the area occupied by the gate lines, increasing the aperture ratio of the array substrate, and improving the transmittance of a display device including the array substrate.

Embodiments of the present disclosure further provide a display device comprising any of the array substrates described above. The array substrate comprises a plurality of gate line groups and a plurality of data lines disposed on the substrate. Each gate line group includes a first gate line and a second gate line insulated from each other, and orthographic projections of the first gate line and the second gate line on the substrate at least partially overlap.

In an exemplary embodiment, the first gate line and the second gate line may be insulated from each other by an insulating film layer disposed therebetween. In particular, the insulating film layer may be made of a resin material.

In the above display device, one gate line group including a first gate line and a second gate line is disposed between two adjacent rows of pixel units. Each row of pixel units includes a plurality of pixel unit groups, wherein each pixel unit group includes a first pixel unit and a second pixel unit, and the first pixel unit and the second pixel unit in each pixel unit group share one data line. In each pixel unit group, a thin film transistor of the first pixel unit is connected to the first gate line, and a thin film transistor of the second pixel unit is connected to the second gate line in the same gate line group. The first gate line is disposed on a side of the insulating film layer close to the substrate, and the second gate line is disposed on a side of the insulating film layer away from the substrate. At position of the thin film transistor of the first pixel unit, the array substrate may further comprise a first gate connection line disposed in the same layer as the second gate line. The first gate connection line is electrically connected to the first gate line through a via hole in the insulating film layer.

Further, the array substrate may further comprise a gate insulating layer, an active layer, a data line, a drain, a common electrode, a first electrode layer, a passivation layer, and a second electrode layer disposed on the second gate line.

In various exemplary embodiments, the display device may be any product or component that has a display function, such as an electronic paper, a mobile phone, a tablet computer, a television, a display, a notebook computer, a digital photo frame, a navigator, and the like.

In embodiments of the present disclosure, the display device comprises an array substrate. In the array substrate, a plurality of gate line groups and a plurality of data lines are disposed on a substrate, each gate line group includes a first gate line and a second gate line insulated from each other, and orthographic projections of the first gate line and the second gate line on the substrate at least partially overlap. By arranging the two gate lines in the array substrate in a stacked manner, width of each gate line group as viewed from a top surface of the array substrate can be greatly reduced, thereby effectively reducing the area occupied by the gate lines, increasing the aperture ratio of the array substrate, and improving the transmittance of the display device.

Figure 5:
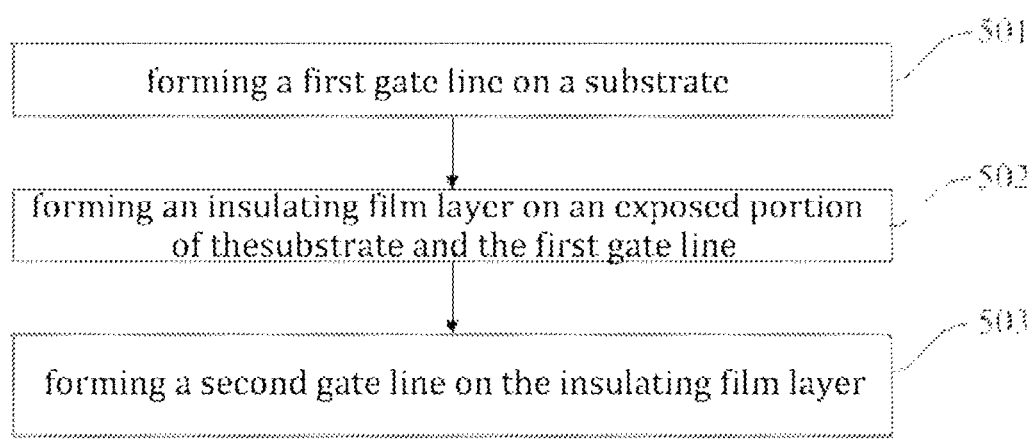
FIG. 5 shows a flowchart of a manufacturing method of an array substrate according to embodiments of the present disclosure.

Referring to FIG. 5, a flowchart of a manufacturing method of an array substrate according to embodiments of the present disclosure is illustrated. As shown in FIG. 5, the manufacturing method may comprise forming a first gate line on a substrate at step 501.

In step 501, in conjunction with FIGS. 2 and 3, the first gate line 11 is formed on the substrate 16 by a patterning process. The patterning process generally includes steps such as exposure, development, etching, and the like.

Next, at step 502, an insulating film layer is formed on an exposed portion of the substrate and the first gate line.

In step 502, in conjunction with FIGS. 2 and 3, after the first gate line 11 is formed on the substrate 16, the insulating film layer 23 is formed on an exposed portion of the substrate 16 and the first gate line 11.

Then, at step 503, a second gate line is formed on the insulating film layer such that orthographic projections of the first gate line and the second gate line on the substrate at least partially overlap.

In step 503, in conjunction with FIGS. 2 and 3, after the insulating film layer 23 is formed, the second gate line 12 is formed on the insulating film layer such that orthographic projections of the first gate line 11 and the second gate line 12 on the substrate 16 at least partially overlap, thereby effectively reducing the area occupied by the gate lines.

In an exemplary embodiment, the above manufacturing method may further comprise: etching a via hole in the insulating film layer; forming a second gate line and a first gate connection line on the insulating film layer, wherein the first gate line is electrically connected to the first gate connection line through the via hole formed in the insulating film layer, and the first gate connection line is located at a position of the thin film transistor connected to the first gate line.

In other exemplary embodiments, the above manufacturing method may further comprise: after the second gate line is formed on the insulating film layer, forming, on the second gate line, a gate insulating layer, an active layer, a data line, a drain, a common electrode, a first electrode layer, a passivation layer, and a second electrode layer.

In conjunction with FIGS. 2, 3 and 4, the gate insulating layer 19, the active layer 20, the data line 13, the drain 14, the common electrode 15, the first electrode layer 21, the passivation layer 18, and the second electrode layer 22 are formed on the second gate line 12.

In embodiments of the present disclosure, a plurality of gate line groups and a plurality of data lines are disposed on a substrate, each gate line group includes a first gate line and a second gate line insulated from each other, and orthographic projections of the first gate lines and the second gate line on the substrate at least partially overlap. By arranging the two gate lines in the array substrate in a stacked manner, width of each gate line group as viewed from a top surface of the array substrate can be greatly reduced, thereby effectively reducing the area occupied by the gate lines, increasing the aperture ratio of the array substrate, and improving the transmittance of a display device comprising the array substrate.

It is to be noted that, in the foregoing description of the manufacturing method, it is expressed as a series of action combinations for the convenience of description. However, those skilled in the art should realize that the present disclosure is not limited to the described sequence of actions, as some steps may be performed in other sequences or concurrently according to the present disclosure. In addition, those skilled in the art should also realize that the embodiments described in the specification all belong to exemplary embodiments, and the involved actions and modules are not necessarily required to implement the concept of the present disclosure.

Each embodiment in this specification is described in a progressive manner, each embodiment focuses on the differences from other embodiments, and the same or similar parts among the embodiments can be referred to each other.

Finally, it is to be further noted that, relational terms herein such as first, second, etc. are only used to distinguish one entity or operation from another entity or operation, and do not necessarily require or imply that these entities or operations have any such actual relationship or order. Moreover, the terms "comprising", "including", or any other variations thereof are intended to cover a non-exclusive inclusion such that a process, a method, a commodity or an apparatus that comprises a list of elements includes not only those elements but also elements not explicitly listed, or further includes elements that are inherent to the process, the method, the commodity or the apparatus. In the case of no more limitation, the element defined by the sentence "comprising a . . . " does not exclude the existence of another identical element in the process, the method, the commodity, or the apparatus comprising said element.

The array substrate, the manufacturing method thereof, and the display device provided by the present disclosure have been described in detail above. Specific examples are used herein to explain the principle and the implementation manner of the present disclosure. The above embodiments are only used to assist in understanding the method and the core idea of the present disclosure. At the same time, those ordinarily skilled in the art will make variations to the specific implementation manners and the application scope according to the idea of the present disclosure. In summary, the contents of the present specification should not be understood as a limitation of the present disclosure.

The invention claimed is:

1. An array substrate comprising a plurality of gate line groups and a plurality of data lines disposed on a substrate, wherein the plurality of gate line groups is sandwiched between the plurality of data lines and the substrate,
   wherein the plurality of gate line groups intersects with the plurality of data lines to define a plurality of pixel units arranged in an array, the plurality of pixel units comprises a plurality of rows of pixel units, each of the plurality of rows of pixel units in the array comprises a plurality of pixel unit groups, each of the plurality of pixel unit groups includes a first pixel unit and a second pixel unit sharing a same one of the plurality of data lines;
   wherein each of the plurality of gate line groups includes a first gate line and a second gate line and the first gate line and the second gate line are insulated from each other;
   wherein orthographic projections of the first gate line and the second gate line of each of the plurality of gate line groups on the substrate at least partially overlap;
   wherein, in a direction perpendicular to the plurality of rows, in an area of the array substrate other than an intersection of each of the plurality of data lines and each of the plurality of gate line groups, a width of each of the plurality of gate line groups is smaller than a sum of widths of the first gate line and the second gate line of each of the plurality of gate line groups,
   wherein the array substrate further comprises an insulating film layer disposed between the first gate line and the second gate line of each of the plurality of gate line groups,
   wherein the first gate line is disposed at a side of the insulating film layer close to the substrate;
   wherein the second gate line is disposed at a side of the insulating film layer away from the substrate,
   wherein the first gate line is disposed at a side of the insulating film layer away from the plurality of data lines;
   wherein the second gate line is disposed at a side of the insulating film layer close to the plurality of data lines, and
   wherein at a position of a thin film transistor of the first pixel unit, the array substrate further comprises a first gate connection line disposed in a same layer as the second gate line, the first gate connection line being electrically connected to the first gate line.

2. The array substrate according to claim 1, wherein in each of the plurality of pixel unit groups, the thin film transistor of the first pixel unit is connected to the first gate line in a corresponding gate line group, and a thin film transistor of the second pixel unit is connected to the second gate line in the corresponding gate line group.

3. The array substrate according to claim 1, wherein orthographic projections of the first gate line and the first gate connection line on the substrate completely overlap.

4. A display device comprising an array substrate,
   wherein the array substrate comprises a plurality of gate line groups and a plurality of data lines disposed on a substrate, the plurality of gate line groups is sandwiched between the plurality of data lines and the substrate, the plurality of gate line groups intersects with the plurality of data lines to define a plurality of pixel units arranged in an array, the plurality of pixel units comprises a plurality of rows of pixel units, each of the plurality of rows of pixel units in the array comprises a plurality of pixel unit groups, each of the plurality of pixel unit groups includes a first pixel unit and a second pixel unit sharing a same one of the plurality of data lines, wherein each of the plurality of gate line groups includes a first gate line and a second gate line insulated from each other, and orthographic projections of the first gate line and the second gate line of each of the plurality of gate line groups at least partially overlap,
   wherein, in a direction perpendicular to the plurality of rows, in an area of the array substrate other than an intersection of each of the plurality of data lines and each of the plurality of gate line groups, a width of each of the plurality of gate line groups is smaller than a sum of widths of the first gate line and the second gate line of each of the plurality of gate line groups,
   wherein the array substrate further comprises an insulating film layer disposed between the first gate line and the second gate line of each of the plurality of gate line groups,
   wherein the first gate line is disposed at a side of the insulating film layer close to the substrate,
   wherein the second gate line is disposed at a side of the insulating film layer away from the substrate,
   wherein the first gate line is disposed at a side of the insulating film layer away from the plurality of data lines;
   wherein the second gate line is disposed at a side of the insulating film layer close to the plurality of data lines, and
   wherein at a position of a thin film transistor of the first pixel unit, the array substrate further comprises a first gate connection line disposed in a same layer as the second gate line, the first gate connection line being electrically connected to the first gate line.

5. The display device according to claim 4, wherein within each of the plurality of pixel unit groups, the thin film transistor of the first pixel unit is connected to the first gate line in a corresponding gate line group, and a thin film transistor of the second pixel unit is connected to the second gate line in the corresponding gate line group.

6. The display device according to claim 4, wherein orthographic projections of the first gate line and the first gate connection line on the substrate completely overlap.

7. A manufacturing method of an array substrate, comprising:
   forming a plurality of gate line groups and a plurality of data lines on a substrate, wherein the plurality of gate line groups is sandwiched between the plurality of data lines and the substrate, the plurality of gate line groups intersects with the plurality of data lines to define a plurality of pixel units arranged in an array, the plurality of pixel units comprises a plurality of rows of pixel units, each of the plurality of rows of pixel units in the array comprises a plurality of pixel unit groups, each of the plurality of pixel unit groups includes a first pixel unit and a second pixel unit sharing a same one of the plurality of data lines,
   wherein forming each of the plurality of gate line groups comprises:
      forming a first gate line on the substrate;
      forming an insulating film layer on an exposed portion of the substrate and the first gate line; and forming a second gate line on the insulating film layer,
wherein orthographic projections of the first gate line and the second gate line on the substrate at least partially overlap,
wherein, in a direction perpendicular to the plurality of rows, in an area of the array substrate other than an intersection of each of the plurality of data lines and each of the plurality of gate line groups, a width of each of the plurality of gate line groups is smaller than a sum of widths of the first gate line and the second gate line of each of the plurality of gate line groups,
wherein the first gate line is disposed at a side of the insulating film layer away from the plurality of data lines,
wherein the second gate line is disposed at a side of the insulating film layer close to the plurality of data lines,
wherein the step of forming the second gate line on the insulating film layer comprises:
forming a via hole in the insulating film layer, and
forming the second gate line and a first gate connection line in a same layer on the insulating film layer,
wherein the first gate line is electrically connected to the first gate connection line through the via hole, and the first gate connection line is located at a position of a thin film transistor connected to the first gate line.

8. The manufacturing method according to claim 7, wherein orthographic projections of the first gate line and the first gate connection line on the substrate completely overlap.

9. The manufacturing method according to claim 7, wherein after the step of forming a second gate line on the insulating film layer, the manufacturing method further comprises:
forming a gate insulating layer, an active layer, a drain, a common electrode, a first electrode layer, a passivation layer, and a second electrode layer on the second gate line.

* * * * *